(12) United States Patent
Schulze et al.

(10) Patent No.: US 7,822,800 B2
(45) Date of Patent: Oct. 26, 2010

(54) APPARATUS AND METHOD FOR PERFORMING A CALCULATION OPERATION

(75) Inventors: Thomas Schulze, Würzburg (DE); Carsten Wegner, Siegen (DE)

(73) Assignee: Camco Produktions-und Vertriebs GmbH fur Beschallungs-und Beleuchtungsanlagen, Wenden-Gerlingen (DE)

( * ) Notice: Subject to any disclaimer, the term of this patent is extended or adjusted under 35 U.S.C. 154(b) by 1194 days.

(21) Appl. No.: 11/436,514

(22) Filed: May 19, 2006

(65) Prior Publication Data

US 2007/0288541 A1    Dec. 13, 2007

(51) Int. Cl.
| | |
|---|---|
| G06F 7/50 | (2006.01) |
| H04J 9/00 | (2006.01) |
| H04J 7/00 | (2006.01) |
| H03M 5/08 | (2006.01) |
| H03M 1/00 | (2006.01) |
| G06F 17/50 | (2006.01) |
| G06F 7/00 | (2006.01) |
| H03F 3/26 | (2006.01) |
| H03F 3/38 | (2006.01) |
| G10L 19/00 | (2006.01) |

(52) U.S. Cl. .............. 708/675; 370/204; 370/212; 341/53; 341/110; 341/124; 708/101; 708/209; 330/260; 330/10; 704/212

(58) Field of Classification Search ......... 708/846–848, 708/9, 101–103; 375/241–254, 264, 286–294; 363/41–43, 25–26, 21.1–21.11; 704/212; 386/E9.017–E9.019, E5.017–E5.019, E9.023–E9.024, 386/E9.012, E5.012, E5.036, E9.059; 341/53, 341/143, 157, 178–183, 184–190, 29–30; 330/250–311

See application file for complete search history.

(56) References Cited

U.S. PATENT DOCUMENTS

| | | | | |
|---|---|---|---|---|
| 3,500,387 | A | * | 3/1970 | Craven et al. ............... 341/110 |
| 4,129,751 | A | * | 12/1978 | Alles .......................... 370/212 |
| 4,718,057 | A | * | 1/1988 | Venkitakrishnan et al. .. 370/229 |
| 5,598,353 | A | * | 1/1997 | Heyl ........................... 708/290 |
| 5,920,842 | A | * | 7/1999 | Cooper et al. ............... 704/503 |
| 6,098,046 | A | * | 8/2000 | Cooper et al. ............... 704/503 |
| 6,421,636 | B1 | * | 7/2002 | Cooper et al. ............... 704/205 |
| 6,518,838 | B1 | * | 2/2003 | Risbo ........................... 330/10 |

(Continued)

OTHER PUBLICATIONS

Author: AV Talk; Title: "Bass Management in DVD players—why is it so bad?"; Date: Jun. 11, 2003; URL: http://www.avtalk.co.uk//showthread.php?t=305.*

(Continued)

Primary Examiner—Lewis A Bullock, Jr.
Assistant Examiner—Joseph Kelly
(74) Attorney, Agent, or Firm—Greenblum & Bernstein P.L.C.

(57) ABSTRACT

The invention provides an apparatus and a method for performing a calculation operation with at least one input signal consisting of signal sections, wherein each signal section of said input signal has a constant amplitude. The apparatus comprises a signal transformation unit for transforming at least one input signal into a first intermediary signal having a virtual amplitude with respect to at least one carrier signal. The calculation unit is provided for performing the calculation operation on said first intermediary signal to generate a second intermediary signal. A signal re-transformation unit re-transforms the second intermediary signal into an output signal consisting of signal sections, wherein each signal section of said output signal has a constant amplitude.

30 Claims, 10 Drawing Sheets

U.S. PATENT DOCUMENTS

| | | | |
|---|---|---|---|
| 6,901,209 B1 * | 5/2005 | Cooper et al. | 386/109 |
| 6,965,339 B2 * | 11/2005 | Midya et al. | 341/163 |
| 6,973,431 B2 * | 12/2005 | Cooper et al. | 704/503 |
| 7,248,089 B2 * | 7/2007 | Pedersen et al. | 327/172 |
| 7,276,963 B2 * | 10/2007 | Wegner | 330/10 |
| 7,286,009 B2 * | 10/2007 | Andersen et al. | 330/10 |
| 7,307,557 B2 * | 12/2007 | Wegner et al. | 341/76 |
| 7,443,235 B2 * | 10/2008 | Mun et al. | 330/10 |
| 2006/0028272 A1 * | 2/2006 | Ozawa et al. | 330/251 |

OTHER PUBLICATIONS

Author: Taura et al.; Title: "Development of a Digital Amplifier for Car Use"; Date: Oct. 13, 2003; URL: http://www.aes.org/tmpFiles/elib/20100322/12446.pdf.*

Author: Nielsen et al.; Title: "Parallel Phase Shifted Carrier Pulse Width Modulation (PSCPWM)—A Novel Approach to Switching Power Amplifier Design"; Date: Mar. 25, 1997; URL: http://www.aes.org/e-lib/browse.cfm?elib=7332.*

Author: Tolbert et al.; Title: "Multilevel PWM Methods at Low Modulation Indices"; Date: 1999; URL: http://web.eecs.utk.edu/~tolbert/publications/apec99.pdf.*

Author: Midya et al; Title: "Prediction Correction Algorithm for Natural Pulse-Width Modulation"; Date: Sep. 2000; URL: http://www.aes.org/e-lib/inst/browse.cfm?elib=9144.*

* cited by examiner

PULSE MODULATION METHODS

APPARATUS AND METHOD FOR PERFORMING A CALCULATION OPERATION

The invention relates to an apparatus and a method for performing a calculation operation with at least one input signal consisting of signal sections, wherein each signal section has a constant amplitude.

TECHNICAL BACKGROUND

In many applications there is a need to perform mathematical operations with two-dimensional continuous time signals, such as pulse-width modulated signals. In a two-dimensional continuous time signal the information is encoded into the amplitude as well as into the time location of signal edges of the continuous time signal. A mathematical operation with such signals becomes, for instance, necessary when such a signal is fed back and subtracted from an input signal to close a feedback loop.

There are many different kinds of continuous time signals having at least two discrete amplitude values.

FIG. 1 shows four basic pulse modulation techniques according to the state of the art, i. e. pulse amplitude modulation (PAM), pulse-width modulation (PWM), pulse position modulation (PPM) and pulse density modulation (PDM).

Pulse-width modulation is different from PAM in that it provides information in time whereas PAM provides the information in the amplitude. The pulse-width modulated signal as shown FIG. 1C has two discrete amplitude values. However, there are more complex pulse-width modulated signals, such as phase-shift carrier pulse-width modulated signals having, for example, four amplitude values. In a phase-shift carrier pulse-width modulated signal the information is encoded into discrete amplitude values and into the time location of signal edges of the continuous time signal.

The pulse position modulation (PPM) differs from pulse-width modulation in that the value of each instantaneous sample of a modulation wave causes the variation of the position in time of a pulse relative to its non-modulated time of a occurrence as shown in FIG. 1B.

Pulse density modulation PDM as shown in FIG. 1D is based on a unity pulse width, height in a constant time of occurrence for the pulse width in the switching period. The modulated parameter is the presence of the pulse. For each sample interval it is determined if the pulse should be present or not, i. e. the density of the pulses is modulated.

Any of the continuous time signals described above can be varied in such that the information is encoded into the time location of the signal edges and into the amplitude values by providing more than two discrete amplitude values.

It is one aspect of the invention to provide an apparatus and a method for performing a calculation operation minimizing the non-linear distortions of the calculated output signal.

SUMMARY OF THE INVENTION

The invention provides an apparatus for performing a calculation operation with at least one input signal consisting of signal sections, wherein each signal section of the input signal has a constant amplitude, wherein the apparatus comprises:

A signal transformation unit for transforming said at least one input signal into a first intermediary signal having a virtual amplitude with respect to at least one carrier signal, a calculation unit for performing the calculation operation on said first intermediary signal to generate a second intermediary signal, and a signal retransformation unit for retransforming said second intermediary signal into an output signal consisting of signal sections, wherein each signal section of said output signal has a constant amplitude.

In a preferred embodiment of the apparatus according to the present invention the input signal is a two-dimensional continuous time signal with at least two discrete amplitude values, wherein the information is encoded into the amplitude and into the time location of signal edges of said continuous time signal.

In a preferred embodiment of the apparatus according to the present invention the first intermediary signal is a one-dimensional continuous time signal with a virtual amplitude wherein the information carried by said two-dimensional input signal is encoded into the virtual amplitude of the first intermediary signal.

In a preferred embodiment of the apparatus according to the present invention the second intermediary signal is a one-dimensional continuous time signal with a virtual amplitude.

In a preferred embodiment of the apparatus according to the present invention the calculation unit receives the first intermediary signal from said signal transformation unit and performs the calculation operation with the first intermediary signal and, if appropriate, with one or more further input signals.

In a preferred embodiment of the apparatus according to the present invention the further input signal consists of signal sections, wherein each signal section of the further input signal has a constant amplitude.

In a preferred embodiment of the apparatus according to the present invention the further input signal is a one-dimensional continuous time signal.

In a preferred embodiment of the apparatus according to the present invention the signal transformation unit comprises a carrier signal generator for each carrier signal to generate the carrier signal.

In a preferred embodiment of the apparatus according to the present invention the signal transformation unit further comprises a comparator for each carrier signal generator which compares the amplitude of the input signal with the amplitude of the generated carrier signal to generate a logical output signal indicating whether the amplitude of the input signal is higher than the amplitude of the carrier signal.

In a preferred embodiment of the apparatus according to the present invention the signal transformation unit further comprises a sample-and-hold circuit for each comparator which is triggered by the logical output signal of the respective comparator to store temporarily the amplitude of the respective carrier signal at an output terminal of the sample-and-hold circuit.

In a preferred embodiment of the apparatus according to the present invention the sample-and-hold circuit is triggered by a rising edge or a by falling edge of the logical signal output at an output terminal of the respective comparator.

In a preferred embodiment of the apparatus according to the present invention the signal transformation unit further comprises a detector circuit which is connected to the output terminals of the comparators and receives the logical output signal of the comparators to detect which carrier signal has caused a rising edge or a falling edge of a logical output signal.

In a preferred embodiment of the apparatus according to the present invention the signal transformation unit further comprises a multiplexer which is controlled by the detector circuit and which has several inputs connected to the output terminals of the sample-and-hold circuit.

In a preferred embodiment of the apparatus according to the present invention the temporarily stored amplitude of the carrier signal detected by the detector circuit is switched by the multiplexer through as a first intermediary signal to the calculation unit.

In a preferred embodiment of the apparatus according to the present invention each carrier signal generator generates a periodic triangular signal.

In an alternative embodiment of the apparatus according to the present invention each carrier signal generator generates a periodic saw tooth signal.

In a preferred embodiment of the apparatus according to the present invention the carrier signal generator is formed by a counter.

In a preferred embodiment of the apparatus according to the present invention the generated carrier signals are phase shifted with respect to each other.

In a preferred embodiment of the apparatus according to the present invention the phase shift between two carrier signals is 360° divided by a number N of provided carrier signals.

In a preferred embodiment of the apparatus according to the present invention the calculation unit is a subtractor for subtracting a feedback signal from said first intermediary signal to generate the second intermediary signal.

In a preferred embodiment of the apparatus according to the present invention the calculation unit performs a selectable calculation operation.

In a preferred embodiment of the apparatus according to the present invention the input signal is generated by a signal source.

In a preferred embodiment of the apparatus according to the present invention the signal source generates the input signal in response to an analogue signal.

In a preferred embodiment of the apparatus according to the present invention the signal source generates the input signal in response to a PCM signal.

In a preferred embodiment of the apparatus according to the present invention the signal retransformation unit comprises an input terminal for receiving the second intermediary signal from the calculation unit, a carrier signal generator provided for each carrier signal, a comparator for each carrier signal generator that compares the second intermediary signal with the respective carrier signal to generate a corresponding comparator output signal, an adder for adding the comparator output signals to generate a sum signal, a scaling unit for scaling the generated sum signal, and an output terminal to output the scaled sum signal as the output signal of said apparatus.

In a preferred embodiment of the apparatus according to the present invention the input signal is a pulse-width modulated signal.

In a preferred embodiment of the apparatus according to the present invention the output signal is performed by a pulse-width modulated signal.

In a preferred embodiment of the apparatus according to the present invention the input signal is a pulse-density modulated signal.

In a preferred embodiment of the apparatus according to the present invention the output signal is a pulse-density modulated signal.

In a preferred embodiment of the apparatus according to the present invention the input signal is a pulse-position modulated signal.

In a preferred embodiment of the apparatus according to the present invention the output signal is a pulse-position signal.

The invention further provides a method for performing a calculation operation with at least one input signal consisting of signal sections wherein each signal section of said input signal has a constant amplitude, wherein the method comprises the following steps:

Transforming said input signal into a first intermediary signal having a virtual amplitude with respect to a carrier signal, performing the calculation operation on said first intermediary signal to generate a second intermediary signal, retransforming said second intermediary signal into an output signal consisting of signal sections, wherein each signal section of said output signal has a constant amplitude.

The invention further provides a computer program for performing a calculation operation with at least one input signal consisting of signal sections wherein each signal section of said input signal has a constant amplitude, said method comprising the following steps:

Transforming said input signal ($S_1$) into a first intermediary signal ($S_2$) having a virtual amplitude with respect to a carrier signal, performing the calculation operation on said first intermediary signal ($S_2$) to generate a second intermediary signal ($S_3$), retransforming said second intermediary signal ($S_3'$) into an output signal ($S_4$) consisting of signal sections, wherein each signal section of said output signal has a constant amplitude.

The invention further provides a data carrier for storing a computer program which performs a method for performing the calculation operation with at least input signal consisting of signal sections, wherein each signal section of the input signal has a constant amplitude, wherein the method comprises the following steps:

Transforming said input signal ($S_1$) into a first intermediary signal ($S_2$) having a virtual amplitude with respect to a carrier signal, performing the calculation operation on said first intermediary signal ($S_2$) to generate a second intermediary signal ($S_3$), retransforming said second intermediary signal ($S_3'$) into an output signal ($S_4$) consisting of signal sections, wherein each signal section of said output signal has a constant amplitude.

DETAILED DESCRIPTION OF THE DRAWINGS

In the following, preferred embodiments of the apparatus and the method for performing a calculation operation are described with reference to enclosed figures.

Figure 1:
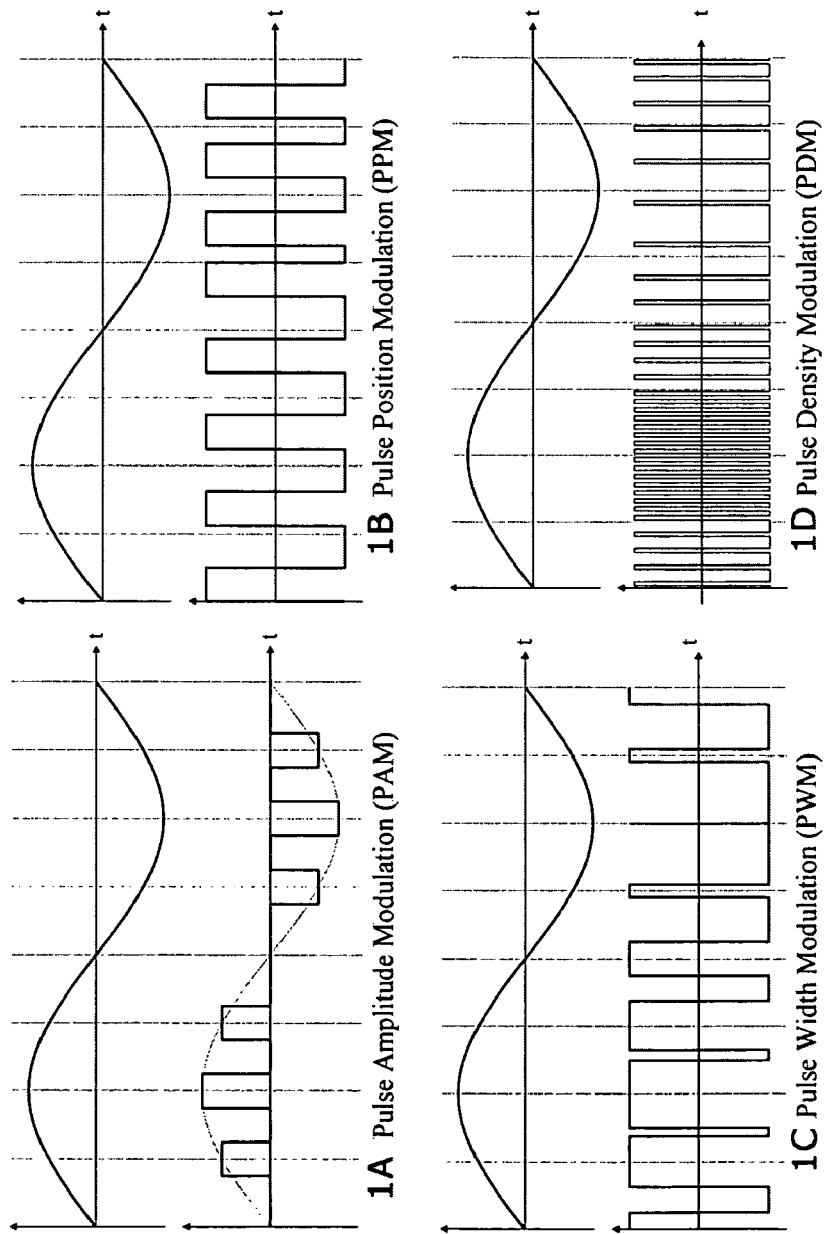
FIGS. 1A-1D show signal diagrams of conventional continuous time signals.
Figure 2:
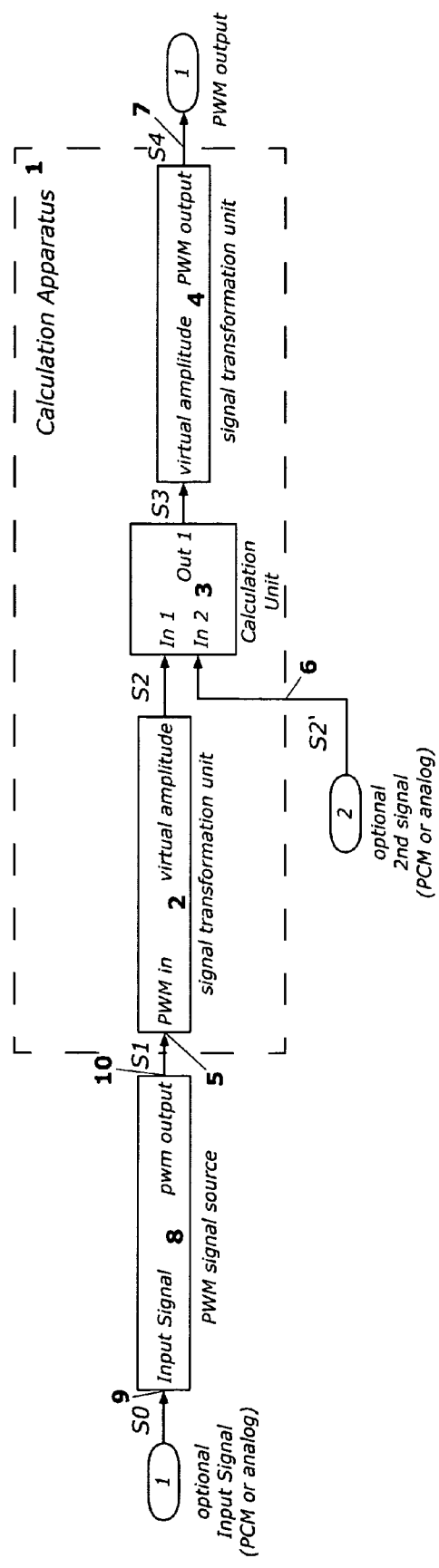
FIG. 2 shows a block diagram of a preferred embodiment of the calculation apparatus according to the present invention.

As can be seen from FIG. 2, the calculation apparatus 1 according to the present invention consists of a signal transformation unit 2 for transforming an input signal $S_1$ into a first intermediary signal $S_2$, a calculation unit 3 for performing a calculation operation on the first intermediary signal $S_2$ to generate a second intermediary signal $S_3$ and a signal retransformation unit 4 for retransforming the second intermediary signal $S_3$ output by the calculation unit 3 into an output signal $S_4$. The calculation apparatus 1 comprises in a preferred embodiment a first input 5 for receiving a first input signal $S_1$ and a second input 6 for receiving a second input signal $S_2'$. The output signal generated by the signal retransformation unit 4 is output at an output terminal 7 of the calculation apparatus 1. The input signal $S_1$ applied to the first input terminal 5 of the calculation apparatus 1 is a two-dimensional continuous time signal with at least two discrete amplitude values wherein the information is encoded into an amplitude and into the time location of signal edges of the continuous time signal. This input signal is, for instance, a pulse-width modulated signal having at least two discrete amplitude values. The input signal can also be a pulse-density modulated signal or a pulse-position modulated signal. The signal transformation unit 2 transforms the input signal $S_1$ into the first intermediary signal $S_2$ which has a virtual amplitude with respect to at least one carrier signal. The calculation unit 3 performs a calculation operation of the transformed first intermediary signal $S_2$ output by the signal transformation unit 2 to generate the second intermediary signal $S_3$ which is supplied to the signal retransformation unit 4. The signal retransformation unit 4 retransforms the second intermediary signal $S_3$ into the output signal $S_4$ which consists of signal sections, wherein each signal section of the output signal $S_4$ has a constant amplitude. The output signal $S_4$ is, for example, also a pulse-width modulated signal. In an alternative embodiment, the output signal $S_4$ is formed by a pulse-density modulated signal or a pulse-position modulated signal.

The input signal $S_1$ can be applied directly to the calculation apparatus 1 as shown in FIG. 2 or is generated by a signal source 8 in response to an analogue or a PCM signal $S_0$.

Figure 3:
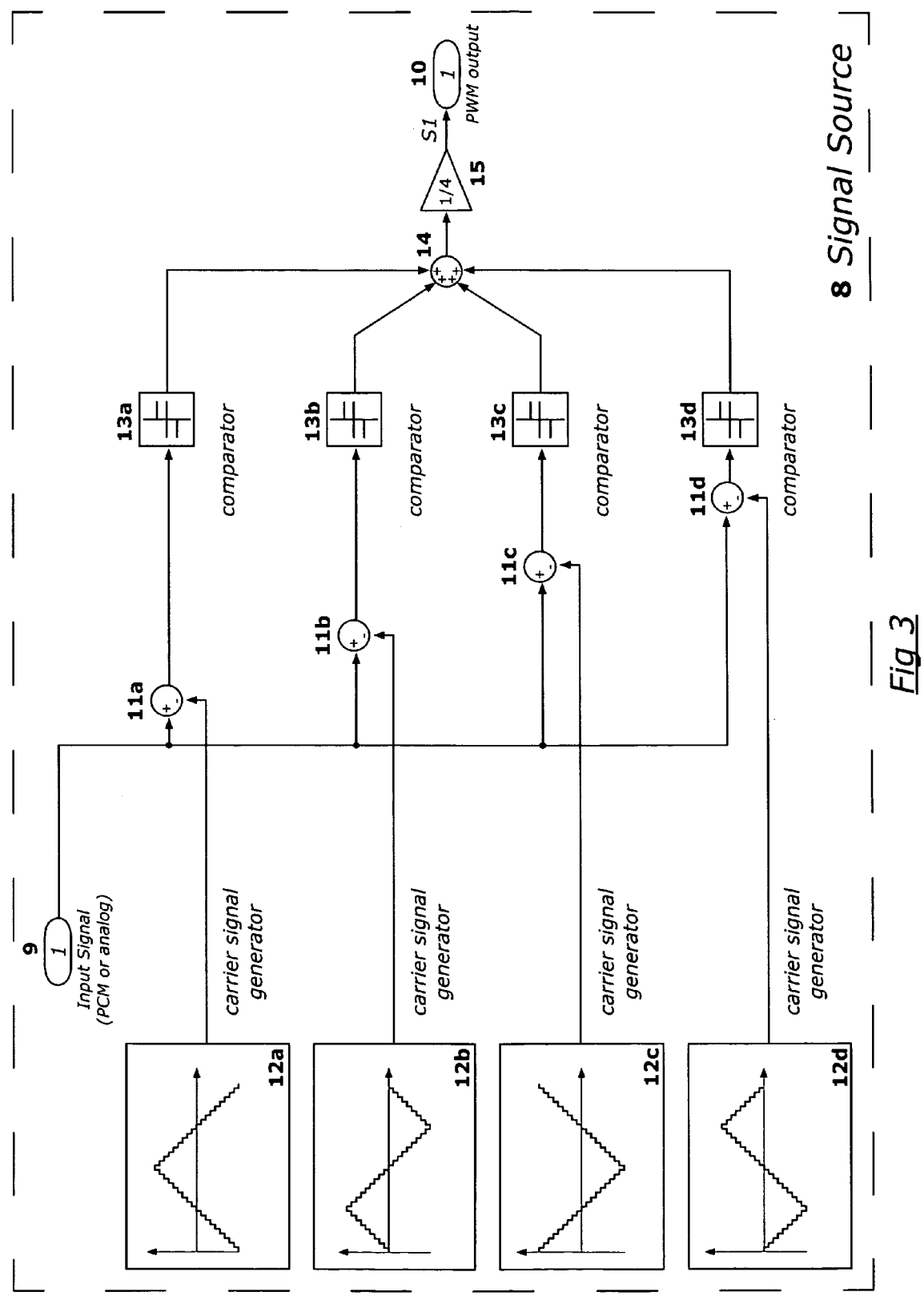
FIG. 3 shows a block diagram of a preferred embodiment of a signal source.

A possible embodiment of a signal source 8 is shown in FIG. 3. The signal source 8 has a signal input 9 and a signal output 10. An analogue input signal or a PCM input signal is applied to the input terminal and then applied to four subtractors 11a, 11b, 11c, 11d as shown in FIG. 3. The signal source 8 as shown in FIG. 3 is a signal source for generating a phase shifted carrier signal by means of four carrier signals generated by carrier signal generators 12a, 12b, 12c, 12d. The carrier signals are, for instance, triangular signals or saw tooth signals. Each carrier signal is phase shifted with respect to the other carrier signals. The phase shift is, for instance, 360° divided by a number N of provided carrier signals. In this shown embodiment, the number of carrier signals is N=4.

From the applied input signal, the different carrier signals are subtracted by means of the subtractors 11a-11d and the respective difference signal is compared by a corresponding comparator 13a-13d with a threshold value, e. g. with a threshold value 0. The generated pulse-width modulated signals are superimposed with each other by means of an adder 14 and scaled by a scaling factor 0.25 by a scaling unit 15. The phase shift carrier signal with four discrete amplitude values is output by the PWM signal source 8 via an output terminal 10 to the input terminal 5 of the calculation apparatus 1 according to the present invention. The input signal $S_1$ is in any case a two-dimensional continuous time signal having at least two discrete amplitude values wherein the information is encoded in both, in the amplitude and into the time location of the signal edges.

Figure 4:
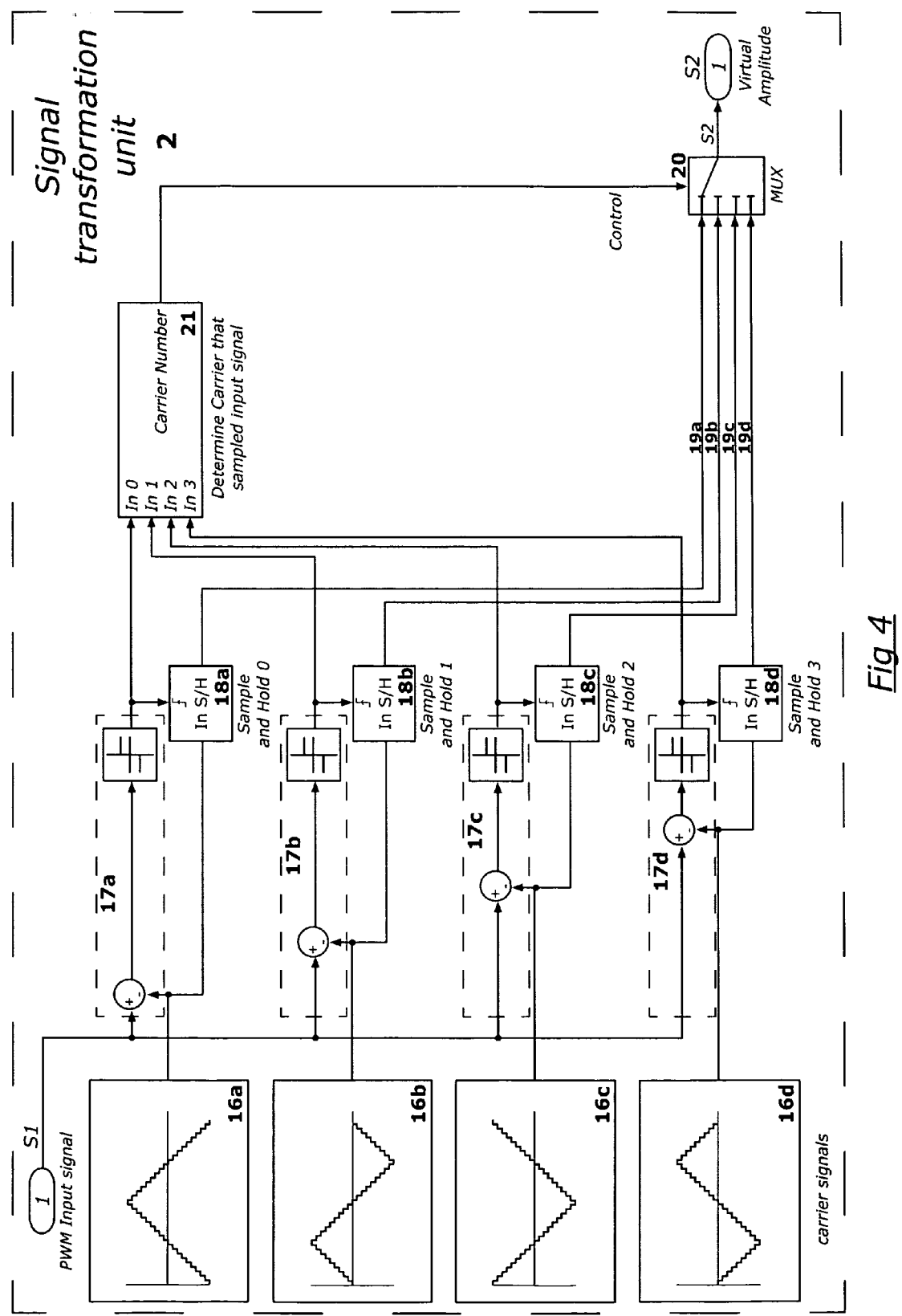
FIG. 4 shows a block diagram of a preferred embodiment of a signal transformation unit within an apparatus according to the present invention.

A preferred embodiment of the signal transformation unit 2 of the calculation apparatus 1 according to the present invention is shown in FIG. 4. The signal transformation unit 2 transforms the input signal $S_1$ into a first intermediary signal $S_2$ having a virtual amplitude with respect to at least one carrier signal. In this shown embodiment, the signal transformation unit 2 comprises four carrier signal generators 16a, 16b, 16c, 16d each generating a carrier signal. In one embodiment, the carrier signals are triangular signals. In alternative embodiments, the carrier signals have saw tooth form. The carrier signals comprise a phase shift of 360° divided by a number of carrier signal generators N=4. The signal transformation unit 2 comprises a comparator 17 for each carrier signal generator as shown in FIG. 4. Each comparator 17 comprises a subtractor to subtract the carrier signal from the received input signal and a comparator comparing the difference signal with a threshold value 0. The comparator 17 compares the amplitude of the input signal which consists of signal sections, wherein each signal section has a constant amplitude, with the amplitude of the generated carrier signal to generate a logical output signal indicating whether the amplitude of the input signal is higher than the amplitude of said carrier signal. The signal transformation unit 2 comprises for each comparator 17 a corresponding sample-and-hold circuit 18 which is triggered by the logical output signal of the respective comparator 17 to store temporarily the amplitude of the respective carrier signal at an output terminal of the sample-and-hold circuit 18. The sample-and-hold circuit 18 is triggered by a rising edge or by a falling edge of the logical signal output by an output terminal of the respective comparator 17. The output terminals of the sample-and-hold circuits 18 are connected via lines 19 to input terminals of a multiplexer 20 which receives a control signal from a detector circuit 21. The detector circuit 21 is connected to the output terminal of the comparators 17 and receives the logical output signals of these comparators 17 to detect which carrier signal has caused a rising edge or a falling edge in the logical output signal. The temporarily stored amplitude of the carrier signal that has caused a rising edge or a falling edge in the corresponding logical output signal is switched by the multiplexer 20 through as the first intermediary signal $S_2$ to the calculation unit 3. The intermediary signal $S_2$ has a virtual amplitude with respect to the carrier signals generated by the carrier signal generator 16a, 16b, 16c, 16d.

Figure 5:
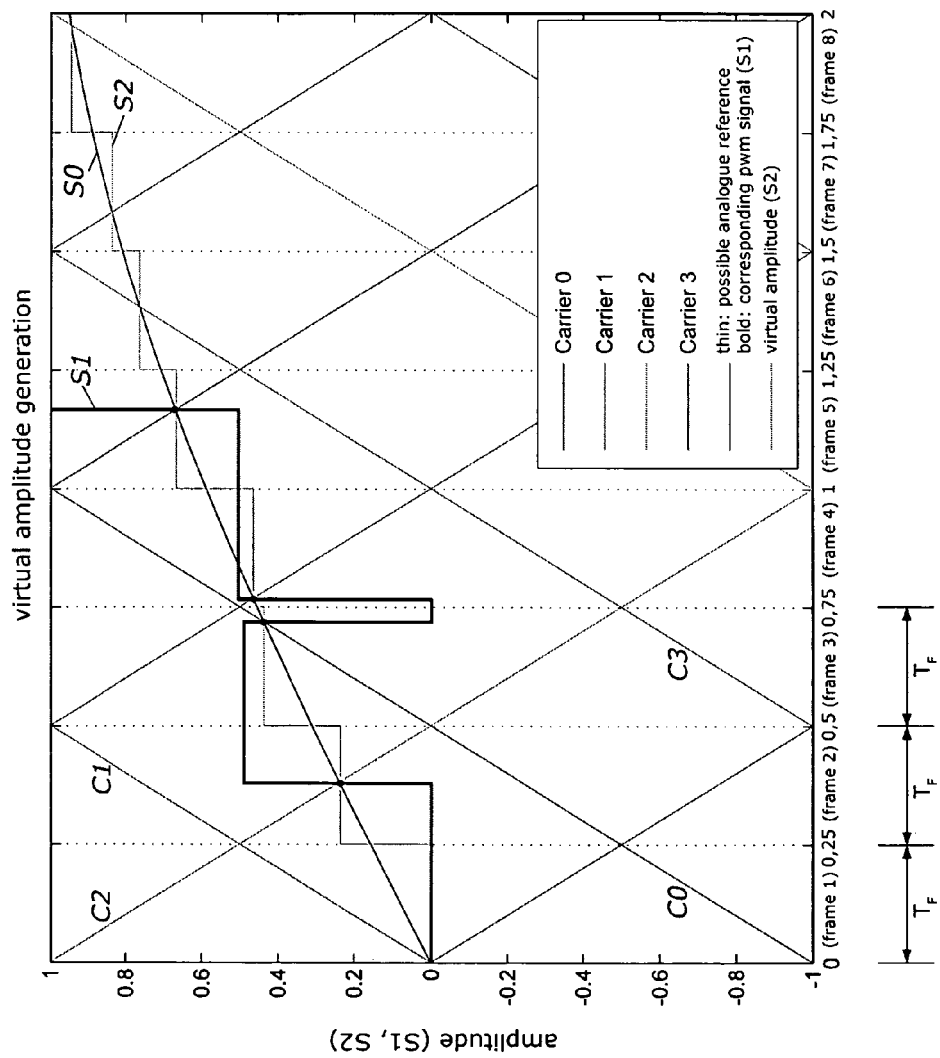
FIG. 5 shows a signal diagram for illustrating the functionality of an apparatus according to the present invention.

FIG. 5 shows a generation of the first intermediary signal $S_2$ by the signal transformation unit 2 using four carrier signals CARRIER0, CARRIER1, CARRIER2, CARRIER3 generated by the carrier signal generator 16a, 16b, 16c, 16d, respectively.

The input signal $S_1$ consists of signal section each having a constant amplitude and can be any two-dimensional continuous time signal with at least two discrete amplitude values wherein the information is encoded into the amplitude and into the time location of the signal edges of this continuous time signal $S_1$. In FIG. 5, the continuous time input signal $S_1$ is shown as a bold line. By use of carriers $C_0, C_1, C_2, C_3$ which are in the given example triangular signals, the continuous time signal $S_1$ is transformed into the first intermediary signal $S_2$ having a virtual amplitude with respect to the carrier signals as shown in FIG. 5. In the given example, the input signal $S_1$ is generated by a signal source 8 in response to an analogue reference $S_0$ being a sine-wave signal. At each crossing point of the continuous time signal $S_1$ with a carrier C, a virtual amplitude of the intermediary signal $S_2$ is defined being constant for a time frame period $T_F$. The time frame is defined by the crossing of two carrier signals $C_i, C_j$ wherein the time frame period $T_F$ is given for a triangular signal as:

$$T_F = 1/2 \cdot N_T \cdot f_T,$$

Wherein $f_T$ is the frequency of the triangular carrier signal and $N_T$ is the number of carrier signals.

For a carrier signal that has a saw tooth form, the time frame period $T_F$ is given by:

$$T_F = 1/N_T \cdot f_T.$$

As can be seen from FIG. 5, the generated first intermediary signal $S_2$ is a one-dimensional continuous time signal with a virtual amplitude wherein the information carried by the two-dimensional input signal is now encoded only in one dimension, i.e. into the virtual amplitude of the first intermediary signal $S_2$. The intermediary signal $S_2$ consists of a plurality of signal sections having a constant amplitude wherein each of these signal sections has a constant time period $T_F$. This corresponds to a PCM signal when the amplitude of the intermediary signal $S_2$ is quantized. With the generated intermediary signal $S_2$ it is possible to perform mathematical operations without generating distortions in the calculated output signal.

Accordingly, the generated first intermediary signal $S_2$ is applied to a calculation unit 3 as shown in FIG. 2. The calculation unit 3 can perform any mathematical operation with the applied intermediary signal $S_2$, such as subtracting or adding another signal. Another possibility is that the intermediary signal $S_2$ is multiplied with another signal or divided by another signal. It is also possible to perform more complex mathematical operations on the intermediary signal, such as calculating a square root etc. The calculation unit 3 may perform a mathematical operation only in response to the first intermediary signal $S_2$ or a mathematical operation with the first intermediary signal with at least another input signal $S_2'$. The second input signal $S_2'$ can be in a preferred embodiment a feedback signal of a feedback loop. The further input signal $S_2'$ consists also of signal sections wherein each signal section of said further input signal $S_2'$ has a constant amplitude. The input signal $S_2'$ is preferably a one-dimensional continuous time signal. Accordingly, the calculation unit 3 performs a mathematical operation of two one-dimensional continuous time signals to generate a second intermediary signal $S_3$ as the calculation result. The calculated resulting intermediary signal $S_2$ is applied to the retransformation unit 4 of the apparatus 1 as shown in FIG. 2.

Figure 6:
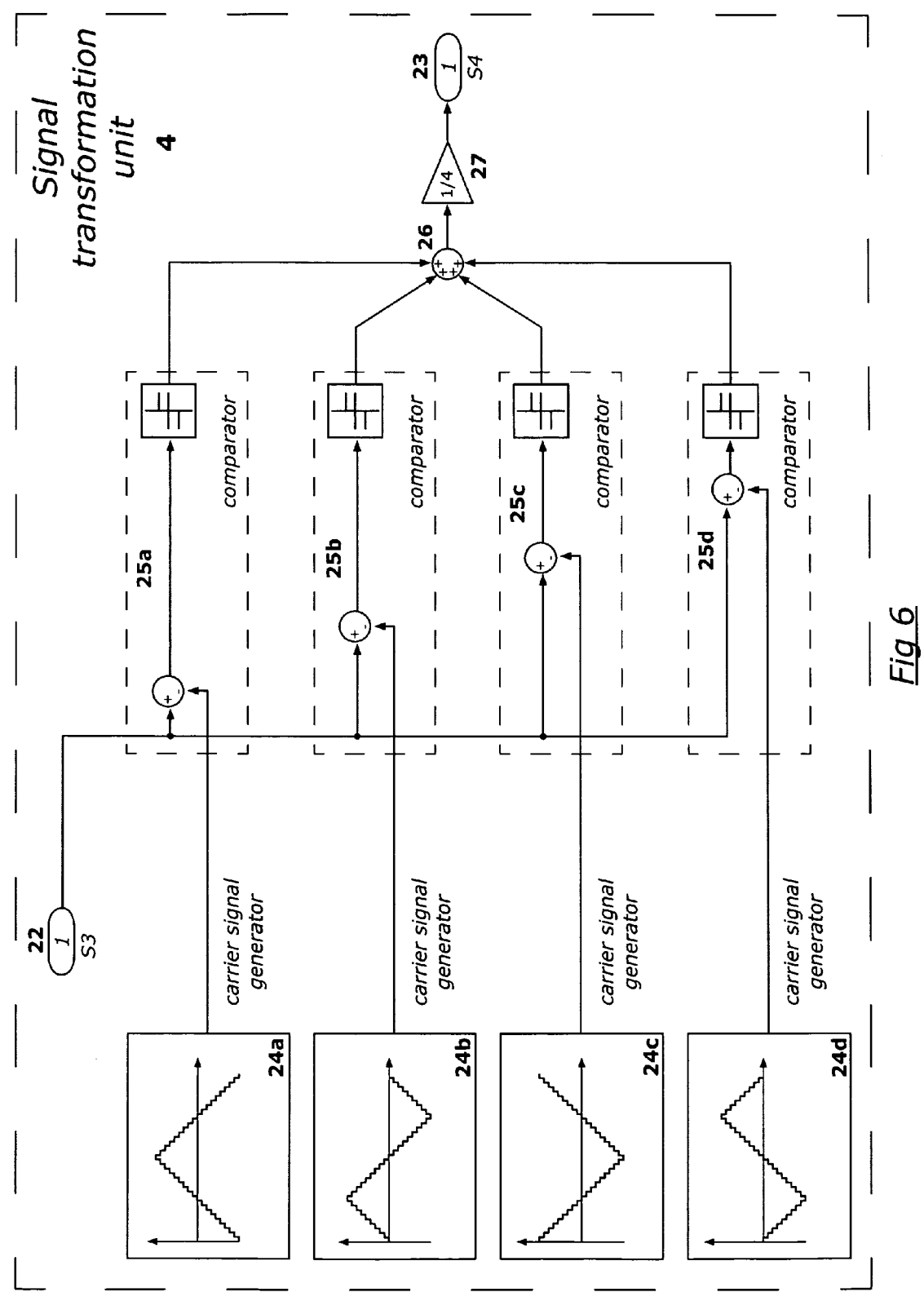
FIG. 6 shows a bock diagram of a preferred embodiment of a signal retransformation unit within an apparatus according to the present invention.

FIG. 6 shows a possible embodiment of such a retransformation unit for retransforming the second intermediary signal $S_3$ into an output signal $S_4$. The signal retransformation unit 4 comprises an input 22 with an output 23 connected to the output 7 of the calculation apparatus 1. The retransformation unit 4 comprises carrier signal generators 24 provided for each carrier signal. For each carrier signal generator, a comparator 25 is provided which compares a second intermediary signal $S_3$ with the respective carrier signal to generate a corresponding comparator output signal. An adder 26 adds the comparator output signals to generate a sum signal which is scaled by a scaling unit 27 to generate the output signal of the calculation apparatus 1 according to the present invention. The output signal $S_4$ consists of signal sections wherein each signal section has a constant amplitude. The output signal $S_4$ can be a pulse-width modulated signal, a pulse-density modulated signal or a pulse-position modulated signal.

The carrier signal generator as employed in a signal transformation unit 2 and the signal retransformation unit 4 as shown in FIGS. 4, 6 can be implemented by counters.

The calculation apparatus can be implemented as a hardware circuit. In an alternative embodiment, a microprocessor executes a program which performs the method according to the present invention.

Figure 10:
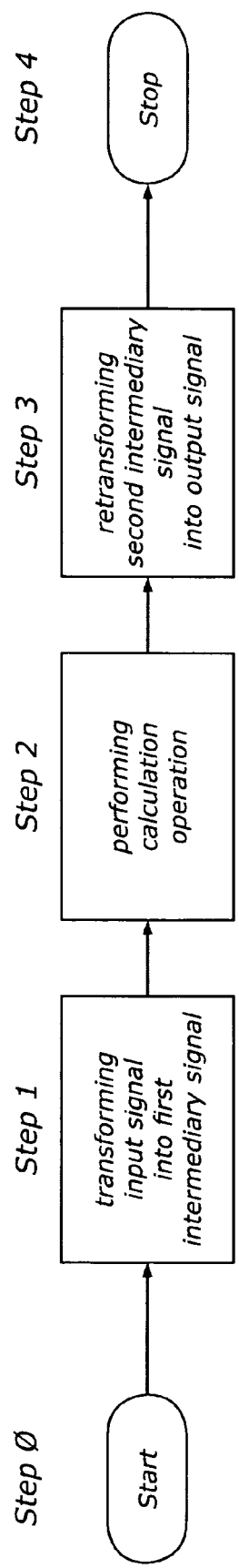
FIG. 10 shows a flowchart of a preferred embodiment of the method according to the present invention.

FIG. 10 shows a flow chart of a possible embodiment of the method according to the present invention.

After a starting step 0, the input signal $S_1$ is transformed in a step 1 into a first intermediary signal $S_2$ having a virtual amplitude with respect to a carrier signal. Then, the calculation operation on the first intermediary signal $S_2$ is performed to generate a second intermediary signal $S_3$ in a step 2. In a third method step, the second intermediary signal $S_3$ is retransformed to an output signal which consists of signal sections wherein each signal section of the output signal $S_4$ has a constant amplitude.

The calculation apparatus 1 as shown in FIG. 2 can be used in many devices, such as control loops, motor control circuits or digital amplifiers. The calculation apparatus according to the present invention can, in particular, be used for performing a mathematical operation with a feedback signal.

Figure 7:
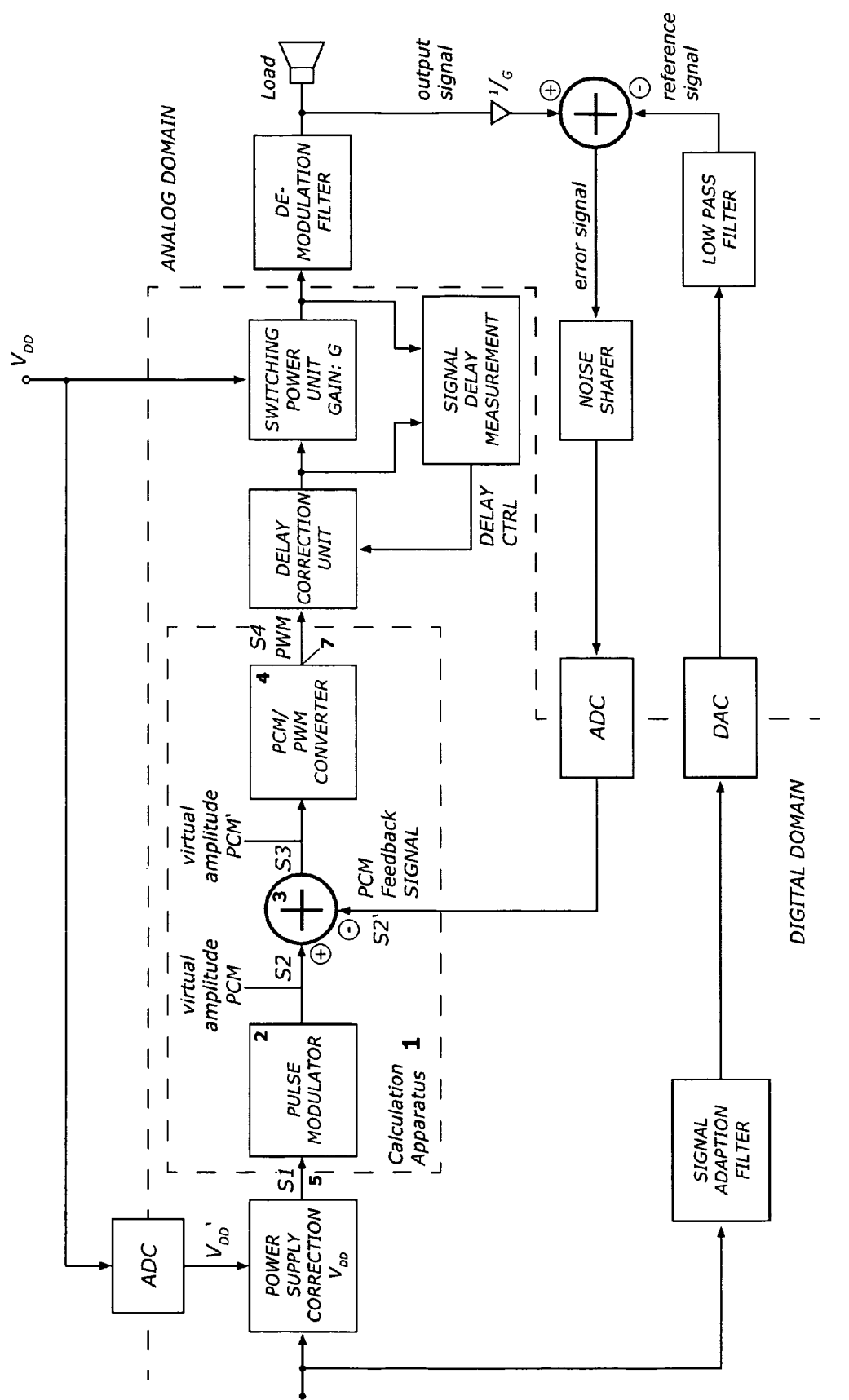
FIG. 7 shows a typical use of an apparatus according to the present invention within a power amplifier.

FIG. 7 shows a possible use of the calculation apparatus 1 within a digital amplifier. In this example, the calculation unit 3 is formed by a subtractor subtracting a PCM feedback signal from the first intermediary signal $S_2$ generated by the signal transformation unit 2 being a pulse modulator.

FIG. 7 shows a switching power amplifier which amplifies an input signal and outputs an amplified analogue signal at an output to a load, such as a loudspeaker. The input signal with the power amplifier is either analogue or digital.

The power amplifier as shown in FIG. 7 comprises a first signal path and a second reference signal path.

The first signal path comprises a power supply correction unit in a calculation apparatus 1 according to the present invention, a delay correction unit which compensates the variation of signal edges of the modulated signal, a switching power unit which amplifies the modulated signal to generate an amplified output signal, and finally, a demodulation filter which filters the amplified output signal generated by the switching power unit to generate an analogue output signal output to the load. Parallel to the switching power unit, a signal delay measurement unit is provided which measures the signal delays caused by the switching power unit to generate a delay control signal for the delay correction unit.

Besides the first signal path, a second signal path is provided within the switching power amplifier for generating a reference signal in response to the input signal applied to the signal input of the switching power amplifier. The second signal path comprises a digital adaption signal filter, a digital-to-analogue converter and an analogue low-pass filter. The digital-to-analogue converter comprises an over-sampling unit. Alternatively, the over-sampling is performed within in the digital signal adaption filter. The digital signal adaption filter causes preferably a delay for compensation of a delay intermediate signal path. The digital-to-analogue converter converts the filter digital input signal output by the signal adaption filter to generate an analogue signal which is filtered by a low-path filter to generate a reference signal.

The transfer function of the first signal path is equal to the transfer function of the reference signal path.

The switching power amplifier as shown in FIG. 7 including the calculation apparatus 1 has a sigma-delta feedback loop which comprises an analogue subtractor which subtracts from the output signal the reference signal, an analogue noise shaper for integrating the error signal and a quantizer for converting the integrated error signal into a digital feedback signal which is fed back to the first signal path, i. e. to the subtractor 3 of the calculation apparatus 1 according to the present invention.

Figure 8:
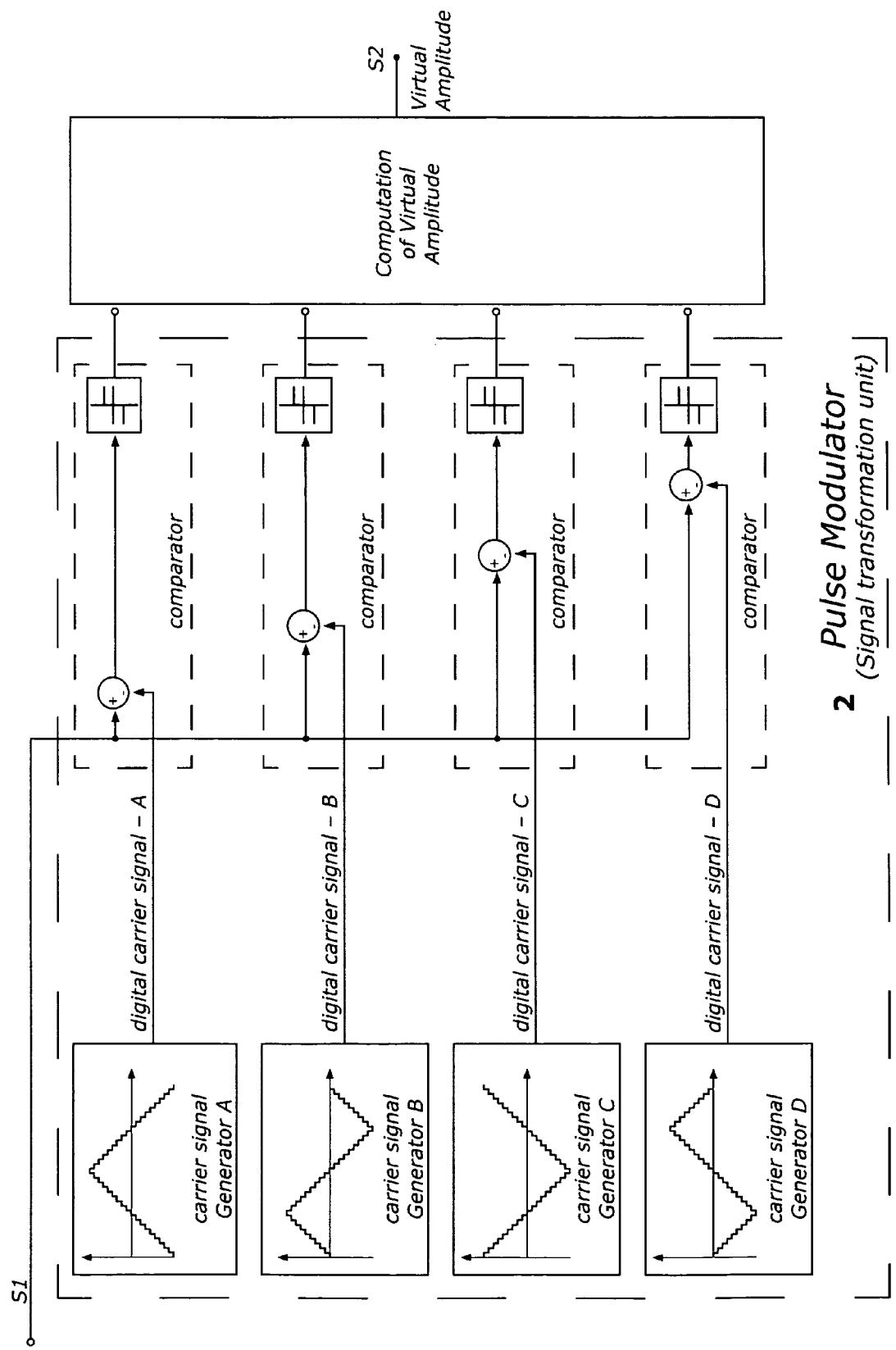
FIG. 8 shows a block diagram of a pulse modulator within the calculation apparatus according to the present invention provided within the power amplifier as shown in FIG. 7.

FIG. 8 shows the pulse modulator 2 of the calculation apparatus 1 as shown in FIG. 7.

Figure 9:
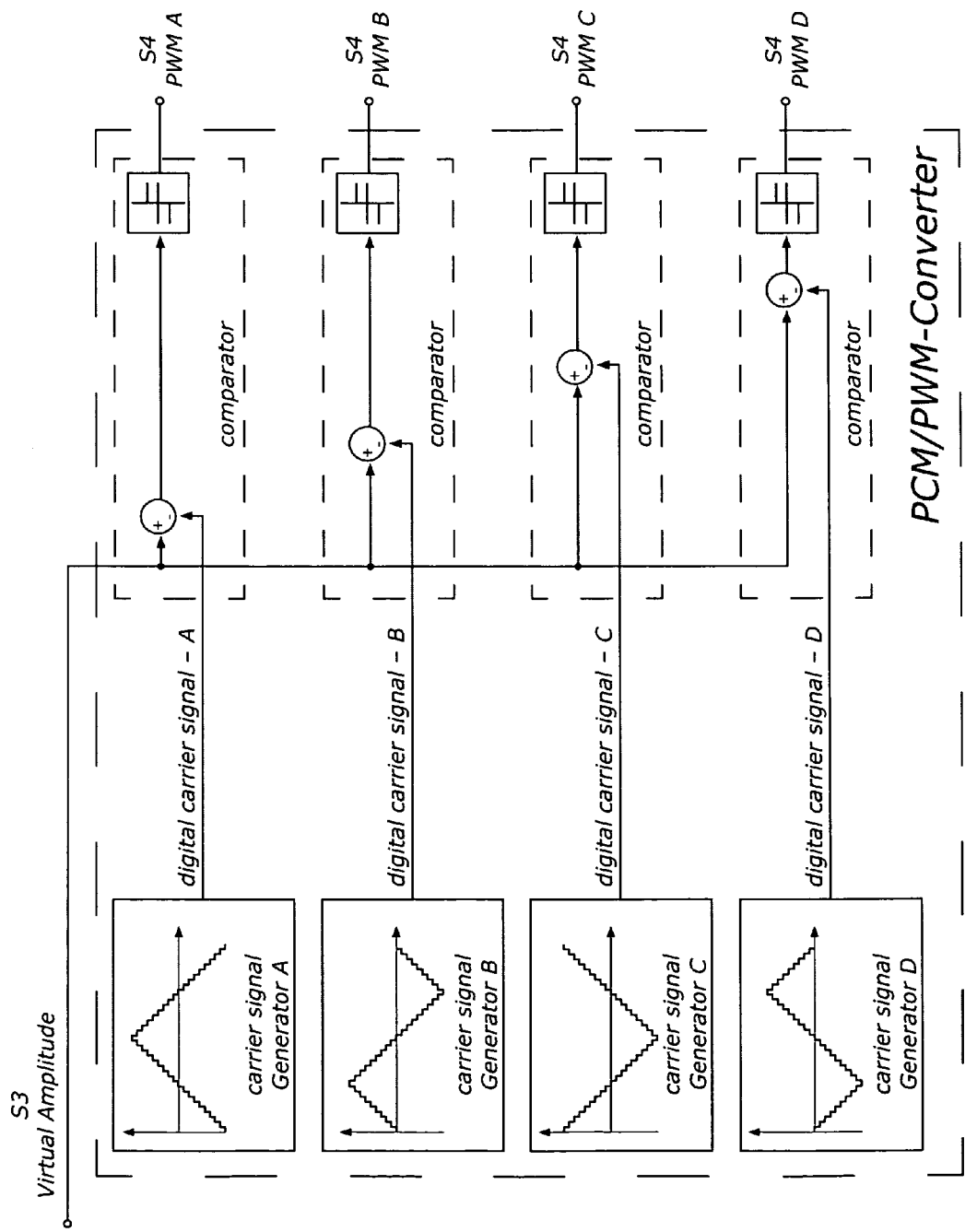
FIG. 9 shows a block diagram of a PCM/PWM converter as employed within the calculation apparatus as shown in FIG. 7.

FIG. 9 shows a block diagram of a PCM/PWM converter 4 of the calculation apparatus 1 according to the present invention as shown in FIG. 7.

The pulse-width modulated signal $S_4$ which forms the output signal of the calculation apparatus 1 according to the present invention does not contain distortions caused by the mathematical operation performed by the subtractor 3 within the calculation apparatus 1 as shown in FIG. 7. Any two-dimensional continuous time signal can be applied to the calculation apparatus 1 within the power amplifier as shown in FIG. 7. The input signal is a two-dimensional continuous time signal having information encoded in the amplitude and into the time of the signal. The pulse modulator 2 transforms the input signal into a first intermediate signal $S_2$ being a one-dimensional continuous time signal with a virtual amplitude wherein the information which originally was carried by the two-dimensional input signal S, is now encoded into the virtual amplitude of the first intermediate signal $S_2$. The first intermediate signal $S_2$ and the feedback signal $S_2$, are both one-dimensional continuous time signals allowing a distortion free mathematical operation by means of the calculation unit 3 which is formed in the given example by a subtractor.

The invention claimed is:

1. A hardware apparatus for performing a calculation operation with at least one input signal consisting of signal sections, wherein each signal section of said input signal has a constant amplitude, said apparatus comprising:
    (a) a signal transformation unit for transforming said at least one input signal into a first intermediary signal having a virtual amplitude with respect to at least one carrier signal;
    (b) a calculation unit for performing the calculation operation on said first intermediary signal to generate a second intermediary signal;
    (c) a signal retransformation unit for retransforming said second intermediary signal into an output signal consisting of signal sections, wherein each signal section of said output signal has a constant amplitude,
    wherein the signal transformation unit comprises:
    (a1) a carrier signal generator for each carrier signal to generate said carrier signal;
    (a2) a comparator for each carrier signal generator which compares the amplitude of said input signal with the amplitude of said generated carrier signal to generate a logical output signal indicating whether the amplitude of said input signal is higher than the amplitude of said carrier signal; and
    (a3) a sample-and-hold circuit for each comparator which is triggered by said logical output signal of the respective comparator to store temporarily the amplitude of the respective carrier signal at an output terminal of said sample-and-hold circuit.

2. The apparatus according to claim 1,
    wherein said input signal is a two-dimensional continuous time signal with at least two discrete amplitude values,
    wherein information is encoded into the amplitude and into the time location of signal edges of said continuous time signal.

3. The apparatus according to claim 1,
    wherein said first intermediary signal is a one-dimensional continuous time signal with a virtual amplitude, wherein the information carried by said two-dimensional input signal is encoded into the virtual amplitude of said first intermediary signal.

4. The apparatus according to claim 1,
    wherein said second intermediary signal is a one-dimensional continuous time signal with a virtual amplitude.

5. The apparatus according to claim 1,
    wherein the calculation unit receives said first intermediary signal from said signal transformation unit and performs the calculation operation with the first intermediary signal and if appropriate with one or more further input signals.

6. The apparatus according to claim 5,
    wherein said further input signal consists of signal sections,
    wherein each signal section of said further input signal has a constant amplitude.

7. The apparatus according to claim 5,
    wherein said further input signal is a one-dimensional continuous time signal.

8. The apparatus according to claim 1,
    wherein said sample-and-hold circuit is triggered by a rising edge or by a falling edge of said logical signal output at an output terminal of the respective comparator.

9. The apparatus according to claim 1,
    wherein said signal transformation unit further comprises:
    (a4) a detector circuit which is connected to the output terminals of the comparators and receives the logical output signals of said comparators to detect which carrier signal has caused a rising edge or a falling edge of a logical output signal.

10. The apparatus according to claim 9, wherein said signal transmission unit further comprises:
    (a5) a multiplexer which is controlled by said detector circuit and which has several inputs connected to the output terminals of said sample-and-hold circuit.

11. The apparatus according to claim 10,
    wherein the temporarily stored amplitude of the carrier signal detected by said detector circuit is switched by said multiplexer through as the first intermediary signal to said calculation unit.

12. The apparatus according to claim 1,
    wherein each carder signal generator generates a periodic triangular signal.

13. The apparatus according to claim 1,
    wherein each carrier signal generator generates a periodic saw tooth signal.

14. The apparatus according to claim 11,
    wherein the carrier signal generator is formed by a counter.

15. The apparatus according to claim 1,
    wherein the generated carrier signals are phase shifted with respect to each other.

16. The apparatus according to claim 15, wherein the phase shift between two carrier signals is 360° divided by a number N of provided carrier signals.

17. The apparatus according to claim 1,
wherein said calculation unit is a subtractor for subtracting a feedback signal from said first intermediary signal to generate said second intermediary signal.

18. The apparatus according to claim 1,
wherein said calculation unit performs a selectable calculation operation.

19. The apparatus according to claim 1,
wherein said input signal is generated by a signal source.

20. The apparatus according to claim 19,
wherein said signal source generates said input signal in response to an analogue signal.

21. The apparatus according to claim 19,
wherein said signal source generates said input signal in response to a PCM signal.

22. The apparatus according to claim 1,
wherein said signal retransformation unit comprises:
(c1) an input terminal for receiving said second intermediary signal from said calculation unit;
(c2) a carder signal generator provided for each carder signal;
(c3) a comparator for each carrier signal generator which compares said second intermediary signal with the respective carrier signal to generate a corresponding comparator output signal;
(c4) an adder for adding the comparator output signals to generate a sum signal;
(c5) a scaling unit for scaling the generated sum signal;
(c6) an output terminal to output the scaled sum signal as the output signal of said apparatus.

23. The apparatus according to claim 1,
wherein said input signal is a pulse width modulated signal.

24. The apparatus according to claim 1,
wherein said output signal is a pulse width modulated signal.

25. The apparatus according to claim 1,
wherein said input signal is a pulse density modulated signal.

26. The apparatus according to claim 1,
wherein said output signal is a pulse density modulated signal.

27. The apparatus according to claim 1,
wherein the input signal is a pulse position modulated signal.

28. The apparatus according to claim 1,
wherein the output signal is pulse position modulated signal.

29. A method for performing a calculation operation with at least one input signal consisting of signal sections, wherein each signal section of said input signal has a constant amplitude, said method implemented by a circuit or processor comprising a carrier signal generator, a comparator, and a sample-and-hold circuit; the method comprising the following steps:
transforming said input signal into a first intermediary signal having a virtual amplitude with respect to a carrier signal;
performing the calculation operation on said first intermediary signal to generate a second intermediary signal; and
retransforming said second intermediary signal into an output signal consisting of signal sections, wherein each signal section of said output signal has a constant amplitude,
wherein the transforming step further comprises:
generating each carrier signal through use of the carrier signal generator;
comparing the amplitude of said input signal with the amplitude of said generated carrier signal to generate a logical output signal indicating whether the amplitude of said input signal is higher than the amplitude of said carrier signal, and
temporarily storing the amplitude of the respective carrier signal when triggered by said logical output signal.

30. A computer-readable storage medium containing computer-readable instructions stored thereon, which when executed by a processor, comprise a computer program for performing the method according to claim 29.

* * * * *